United States Patent

Chiu et al.

[11] Patent Number: 6,133,408
[45] Date of Patent: Oct. 17, 2000

[54] POLYIMIDE RESIN FOR CAST ON COPPER LAMINATE AND LAMINATE PRODUCED THEREFROM

[75] Inventors: Chien-Hwa Chiu; Der-Jen Sun; Yen-Huey Hsu; Fu-Ti Shiang; Chien-Hsiang Chen; Paul S. C. Wu, all of Hsinchu, Taiwan

[73] Assignee: Wirex Corporation, Hasinchu, Taiwan

[21] Appl. No.: 09/231,669

[22] Filed: Jan. 15, 1999

[51] Int. Cl.[7] ................ C08G 73/10; B32B 3/00
[52] U.S. Cl. .......... 528/353; 528/125; 528/128; 528/170; 528/172; 528/173; 528/183; 528/185; 528/220; 528/229; 528/350; 428/209; 428/411.1; 428/458; 428/473.5; 428/457
[58] Field of Search ................ 528/353, 170, 528/172, 173, 183, 185, 220, 229, 350, 125, 128; 428/473.5, 458, 209, 411.1, 457

[56] References Cited

U.S. PATENT DOCUMENTS

| | | | |
|---|---|---|---|
| 4,883,718 | 11/1989 | Ohta et al. | 428/458 |
| 5,200,474 | 4/1993 | Chen et al. | 525/426 |
| 5,290,909 | 3/1994 | Chen et al. | 528/350 |
| 5,300,619 | 4/1994 | Okada et al. | 528/170 |
| 5,372,891 | 12/1994 | Yu et al. | 428/458 |
| 5,830,564 | 11/1998 | Kohno et al. | 528/353 |
| 5,849,397 | 12/1998 | Kohno et al. | 528/353 |

*Primary Examiner*—P. Hampton-Hightower
*Attorney, Agent, or Firm*—Bacon & Thomas

[57] ABSTRACT

A polyimide resin having good thermal stability and good adhesion to a metal foil is disclosed. The polyimide resin is prepared by dissolving at least one diamine in a polar aprotic solvent followed by the addition of an aromatic tetracarboxylic acid dianhydride to the solution of the aromatic diamines to prepare a polyamic acid solution, imidizing this solution to a polyimide resin by heating at a temperature above 250° C., the polar aprotic solvent comprising at least 1 weight % of acetone. Polyimide laminates with a metal foil, such as a copper foil, are also described. The laminates may be used to form flexible printed circuit boards.

16 Claims, No Drawings

POLYIMIDE RESIN FOR CAST ON COPPER LAMINATE AND LAMINATE PRODUCED THEREFROM

The present invention relates to the composition of a polyimide resin having good thermal stability and good adhesion to metal foil. The present invention relates to a polyimide cast on copper laminate having a high dimensional stability and peel strength and having a smooth and flat surface. The present invention relates to a process for preparing a polyamic acid precursory solution and a process for producing polyimide cast on copper laminates.

BACKGROUND OF THE INVENTION

There are many advantages to using flexible printed circuits (FPC). They utilize the thinnest dielectric substrate available for electronic interconnection. FPC is known for its ability to reduce package size as well as package weight. FPC can significantly reduce the weight of an electronic package. This weight reduction makes flexible circuits extremely popular in the portable communication electronics industry. Another advantage of flexible printed circuits is the assembly costs. Reduction of assembly costs is achieved by simplifiing the assembly operations and, in addition, capable of testing the circuitry prior to committing it to assembly work. A properly designed FPC is an excellent means of simplifying the level of interconnection required in an electronic package.

Typically, a laminate of flexible printed circuit consists of a base layer of dielectric and a conductor layer of metal foil. An adhesive layer may be employed to bond the base layer to the conductor layer to form a laminate. Most laminates typically use polyester or polyimide film as flexible base material and use copper foil as conductive layer. On one hand polyimide has excellent electrical, mechanical, and chemical properties in addition to its high thermal and oxidative stability. On the other hand, most flexible printed circuits manufacturing involve a high temperature soldering process, therefore, a polyimide base laminate seems be the best choice today for flexible printed circuits applications.

Adhesive layer has a weak link in a laminate for flexible printed circuits. A so-called adhesiveless laminate can be superior to adhesived laminate in most important areas such as thinness, high temperature resistance, plated through hole processes, and dimensional stability. For application of flexible printed circuitry, thickness reduction is a major benefit brought by adhesiveless laminate and said adhesiveless laminate could also enhance the required dimensional stability and higher flexibility. More importantly, these circuits which have no epoxy adhesive layer could be thermal-cycled without compromissing their terminal integrity or dielectric degradation.

Adhesiveless polyimide laminate may be produced through casting of a polyimide resin onto a metal foil, so-called cast-on-foil, or by metallizing of a polyimide film, so-called seeded film. The process of metallizing of a polymer film is extremely complicated due to the chemical or temperature sensitive conditions of the metallizing processing. Furthermore, production of seeded film can not provide a rolled and annealled type copper clad laminate which as excellent flexure life and is comparable inexpensive of cost and has various choice of metal foil. Finally, the cast-on-foil process can easily be a roll-to-roll process.

However, the cast-on-foil process would encounter a problem, which is, the polyimide resin has poor adhesion to the metal foil. Many solutions in prior inventions tried to promote the adhesion between polyimide resin and metal, which are described as below:

A modified polyimide resin incorporating a siloxane component has been used to enhance the adhesion between polyimide resin and copper foil. However, siloxane incorporation may reduce the thermal properties of polyimide resin.

U.S. Pat. No. 5,200,474 disclosed a polyimide incorporating with bismaleimide which was modified by barbituric acid or the derivatives, used in casting onto copper foil directly. This invention, however, needs more processes to prepare a modified bismaleimide and to mix said modified bismaleimide with polyimide.

U.S. Pat. No. 5,372,891 disclosed a polyimide casting method comprising a polyimide upper layer and a polyimide-bismaleimide lower layer, which exhibits good adhesion characteristics with copper foil. However, this invention must prepare more compositions, and its processes involve more than one casting layer, which makes the production very complicate.

U.S. Pat. No. 5,290,909 disclosed a polyimide prepared by the polymerization reaction involving imidazole- or benzimidazole-containing amine monomers, which makes a polyimide/copper laminate without applying an adhesive layer. This invention, however, needs preparing a modified monomer from more complicated compounds.

The present invention, importantly, produces a polyimide resin by using more common monomers. No specially modified monomers are required in the present invention.

Also in present invention the polyimide resin which contains small amount of inorganic fillers exhibits a dramatic effect in promoting the bonding strength between polyimide and copper foil.

SUMMARY OF THE INVENTION

The above mentioned drawbacks and deficiencies of prior art are overcome or alleviated by present invention.

It is an objective of present invention to provide a composition of polyimide resin having good thermal stability and good adhesion to copper foil.

It is another objective of present invention to provide a polyimide laminate having a high dimensional stability and peel strength, which are important to flexible printed circuits designing and manufacturing.

It is a further objective of present invention to provide a polyimide laminate having a smooth and flat surface, which are critical aspects of flexible printed circuits designing and manufacturing.

It is a further objective of present invention to provide process for preparing a polyamic acid precursory solution and a process for producing polyimide laminates.

DETAILED DESCRIPTION OF THE INVENTION

According to the present invention, a polyimide laminate comprising a polyimide layer and a copper foil, wherein said polyimide laminate is produced by casting of a polyamic acid precursor onto surface of said metal foil followed by imidizing through heating of the resultant at a temperature above 250° C. The polyamic acid is converted to a polyimide resin and formed a polyimide layer on the metal foil. The polyamic acid precursor used to produce the polyimide laminate in present invention is derived from the reaction of aromatic tetracarboxylic acid anhydride and aromatic diamines in a polar aprotic solvent.

The aromatic tetracarboxylic acid anhydrides used in the polyimide resin of present invention are, for example, 3,3',4,4'-Biphenyltetracarboxylic acid dianhydride (BPDA), 3,3',4,4'-Benzophenonetetracarboxylic acid dianhydride (BTDA), Pyromellitic dianhydride (PMDA), 4,4'-Oxydiphthalic anhydride (ODPA), 3,3',4,4'-Diphenylsulfonetetracarboxylic acid dianhydride (DSDA) and their combinations.

The aromatic diamines used in the polyimide resin of present invention are, for example, 4,4'-Oxybisbenzenamine (ODA), m-Phenylenediamine (m-PDA), p-Phenylenediamine (p-PDA), Diaminodiphenyl sulfone (DDS), Diaminobenzophenone, N,N'-Diphenylmethylenediamine, and their combinations.

Combinations of aromatic tetracarboxylic acid anhydrides or aromatic diamines may be included in present invention. An appropriate combination of aromatic tetracarboxylic acid anhydrides or aromatic diamines can always be selected for producing a polyimide resin having good thermal properties. A particularly preferred polyimide resin of present invention is derived from BPDA/BTDA and p-PDA/ODA.

In the combination of aromatic diamines regarding to p-PDA and ODA, polyimide laminate produced therefrom showed lesser peel strength as more p-PDA component presented, and showed lesser dimensional stability as more ODA component presented. For example, when diamines in the polyimide resin contained p-PDA a mole and ODA b mole, and $[a/(a+b)] \times 100$ was greater than 95, it can result a low peel strength in polyimide laminate. On the other hand, when $[a/(a+b)] \times 100$ was lesser than 50, it can result a bad dimensional stability in polyimide laminate. According to present invention, particularly preferred herein polyimide resins are from 60 to 90 mole % of BPDA, 10 to 40 mole % of BTDA, 50 to 95 mole % of p-PDA, and 5 to 50 mole % of ODA. Polyimide resin produced from polyamic acid solution by preparing according to such combination can easily meet the objective of present invention.

The polar aprotic solvents used in present invention are 1-Methy-2-Pyrrolidinone (NMP), N,N-dimethylacetamide (DMAc), N,N-dimethylformamide (DMF), acetone, methyl ethyl ketone (MEK), butyrolactone, and the like. These solvents may be used singly or in mixture of two or more. The combination of solvents can always be selected to dissolve diamines as well as dianhydride powder completely. It is noticeable that when the reacting components were incompletely dissolved, the reaction between dianhydrides and diamines may become in stoichiometric deficiency, resulting polyamic acid may not reach to a high molecular weight, thus the properties of polyimide produced will be undesirable. Because some monomers can not easily be dissolved in a solvent, a long time stirring of the reaction would be necessary for preparing polyamic acid solution achieving enough high molecular weight. Prior arts of polyimide resin preparation all encountered the solubility problem of the monomers used. In present invention, solvent mixture containing small amount of acetone has shown an excellent capacity for dissolving all monomers used. In addition, in most of embodiments of this acetone-containing solvent system, the resulting polyamic acid solution exhibited an inherent viscosity of 1.2 dl/g or greater. It indicated that a high molecular weight polyamic acid has been successfully invented by applying the novel solvent system in present invention.

Polyimide laminate was produced by heating of a polyamic acid solution following by casting onto a metal foil. The processes included a preheating step to remove most solvents used and another high temperature heating step to imidize polyamic acid into polyimide. In the preheating step, a heating program is usually setup to raise the temperatures in a oven gradually to prevent a damage of the laminate surface caused by inappropriate solvents evaporation. According to present invention, a small amount of low boiling point solvent can be evaporated at early stage of the preheating step, which assisted removing all residual solvent at final stage. This is so-called gradual solvent removal and it is favorable to the appearance of the resulting polyimide laminate. Acetone in present invention played a key role and showed many advantages such as improvement in workability of polyamic acid layer formation and production of a qualified polyimide laminate. Since the evaporation of acetone is so quick at high temperature that this cosolvent system may no longer contain acetone after final heating step. In this invention, too small amount of acetone contained in solvent system may, however, not show this advantage of stepping solvent evaporation. According to present invention, solvent system for all of the embodiments comprised acetone which ranged from 1 to 30 weight % in overall solvent system. For example, solvent system used in this invention contained acetone c gram and other solvents d gram, in which $[c/(c+d)] \times 100$ is greater than 1 and lesser than 30.

Inorganic fillers were added to present invention to modify the polyamic acid solution properties to meet the processing requirements. Adding of mica and/or silica to polyamic acid solution can afford adequate flow properties while in the casting process. In polyimide laminate, when by adding of mica and/or silica, a smooth and flat surface can easily be obtained. Furthermore, by adding of mica and/or silica to a polyamic acid solution, the peel strength of polyimide laminate produced therefrom can also be improved. The mica or silica used in this system may disperse thoroughly in the polyimide layer of said laminate, which prevented the diffusion of oxygen into the copper foil surface, thus the oxidation of copper foil was decelerated. As a result, the adhesion between polyimide and copper is improved. In most embodiments which used mica and/or silica as inorganic filler, the peel strength results exhibited 0.8 kgf/cm or greater (JIS 6471-8.1). Other inorganic fillers, for example, calcium carbonate, calcium phosphate, calcium silicate, and talc may also be used in present invention to improve the adhesion between polyimide resin and copper foil. More importantly, the dispersion of mica and/or silica throughout the polyimide layer of said laminate also favored its dimensional stability. A preferred embodiment of polyimide resin in present invention can be ranging from one to 50 parts of mica and/or silica to 100 parts of polyimide resin. An optimal condition should contain 5 to 25 parts of mica and/or silica.

A polyimide laminate in present invention is produced by casting of polyamic acid solution onto surface of copper foil, which formed a polymer layer. Thereafter the heating and imidizing steps of said polyamic acid was applied and a polyimide laminate was produced. In the manufacturing processes the polyamic acid solution was being extruded from a slit die onto a copper foil. In fact the polyamic acid solution was being cast onto a metal foil in succession to produce a polyimide roll clad used in FPC roll-to-roll manufacturing. In particular, said polyamic acid solution is being cast onto a continuously feed copper foil by a quantitatively pumping method through a slit die via an extrusion means. The thickness of the polyamic acid layer can be controlled by adjusting of the input feeding of polyamic acid solution and the unwinding speed of the copper foil roll. An advantage in this novel casting method is that a uniform thickness of polyimide layer in polyimide laminate can be easily achieved.

Most solvents in the polyamic acid solution can be removed by gradual preheating step at temperatures from 50 to 200° C. Lower boiling point solvent is being removed at early stage of preheating step and it assists the formation of a smooth and flat surface. Otherwise the equivalent solvent which evaporated at high temperature may cause a faulty surface appearance. Finally, a solvent-free or less solvent contained green layer of polyamic acid cast sheet is imidized by heating at a temperature above 250° C. The cast sheet can be imidized by heating through a conventional oven and, additionally, a set of infrared radiant heater can be associated with, and the heating profile of infrared radiant heater is set from 300 to 450° C.

The advantages of present invention can be achieved as following examples.

EXAMPLE 1

A mixture of co-solvent system was preparing by adding of 1-Methy-2-Pyrrolidinone (NMP) 170 ml and acetone 30 ml in a reactor, stirring under a low temperature environment, then dissolving of p-Phenylenediamine (p-PDA) 6.5 gram (0.06 mole) and 4,4'-oxybisbenzenamine (ODA) 6.0 gram (0.03 mole) into said solvent mixture. The diamine solution was stirring under a low temperature environment for 3 hours in order to be completely dissolved. Next, Benzophenonetetracarboxylic acid dianhydride (BTDA) 8.7 gram (0.027 mole) and 3,3',4,4'-Biphenyltetracarboxylic acid dianhydride (BPDA) 18.5 gram (0.063 mole) were added to diamines solution gradually, and the reaction solution was stirring under a low temperature environment for 20 hours to form a polyamic acid solution. The viscosity of said polyamic acid solution is measured during the reaction until a viscosity 25,000 cps was achieved, then the reacted solution was removed from the reactor. The resulting polyamic acid solution served as a casting solution for the following cast-on-copper processes:

Cast-on-copper processes were conducted by casting of the polyamic acid solution onto surface of copper foil. The thickness of polyamic acid solution of a cast sheet was 0.3 mm. The cast sheet was preheated in an oven with heating program set from 50 to 200° C. For solvents to be removed, the cast sheet was heated in another oven under a temperature above 350° C. for imidizing of the polyamic acid into a polyimide laminate.

The peel strength of the resulting laminate was determined according to the procedures of JIS 6471-8.1. The dimensional stability of the resulting laminate was determined according to the procedures of IPC-TM-650, method 2.2.4. An apparent inspection after etching procedure showed that the laminate exhibited smooth and flat surface. Peel strength of 1.3 kgf/cm and dimensional stability of −0.16% were obtained.

EXAMPLE 2

Employing the same apparatus and process and solvent mixture as in Example 1, polyamic acid solution was obtained by dissolving of 7.6 gram (0.07 mole) p-PDA and 4.0 gram (0.02 mole) ODA into the solvent mixture following by gradual adding of 8.7 gram (0.027 mole) BTDA and 18.5 gram (0.063 mole) BPDA to the diamines solution. An apparent inspection after etching procedure showed that the laminate exhibited smooth and flat surface. Peel strength of 1.0 kgf/cm and dimensional stability of −0.09% were obtained.

EXAMPLE 3

Employing the same apparatus and processes and solvent mixture as in Example 1, polyamic acid solution was obtained by dissolving of 8.7 gram (0.08 mole) p-PDA and 2.0 gram (0.01 mole) ODA into the solvent mixture following by gradual adding of 8.7 gram (0.027 mole) BTDA and 18.5 gram (0.063 mole) BPDA to diamines solution. An apparent inspection after etching procedure showed that the laminate exhibited a curling appearance in the edge of laminate. Peel strength of 0.8 kgf/cm and dimensional stability of +0.06% were obtained.

According to examples 1 to 3, the resulting polyimide laminate exhibited lower peel strength as more p-PDA molar ratio presented; while better dimensional stability was achieved as more p-PDA molar ratio presented. The results were summarized in Table 1:

Noticeably, polyimide laminate in example 3 showed a curling appearance in the edge of laminate after etching procedure. This disadvantage could be overcome by adding of a small amount of inorganic filler to the system. Following examples described the improvements of inorganic filler addition in present invention.

TABLE 1

|  | example 1 | example 2 | example 3 |
|---|---|---|---|
| molar ratio of PDA | 66 | 78 | 89 |
| PDA (gram) | 6.5 | 7.6 | 8.7 |
| ODA (gram) | 6 | 4 | 2 |
| Peel strength (kgf/cm) | 1.3 | 1 | 0.8 |
| Dimensional stability (%) | −0.16 | −0.09 | 0.06 |
| Appearance after etching | good | good | curled |

EXAMPLE 4

Employing the same apparatus and processes and solvent mixture as in Example 1, additional 4.0 gram (10 weight %) of mica was added into the solvent mixture. Polyamic acid solution was obtained by dissolving of 7.6 gram (0.07 mole) p-PDA and 4.7 gram (0.02 mole) ODA into the mica-containing solvent mixture following by gradual adding of 8.7 gram (0.027 mole) BTDA and 18.5 gram (0.063 mole) BPDA to diamines solution.

An apparent inspection after etching procedure showed that the laminate exhibited smooth and flat surface. Peel strength of 1.5 kgf/cm and dimensional stability of −0.07% were obtained.

EXAMPLE 5

Employing the same apparatus and processes and solvent mixture as in Example 1, additional 8.0 gram (20 weight %) mica was added into the solvent mixture. Polyamic acid solution was obtained by dissolving of 7.6 gram (0.07 mole) p-PDA and 4.0 gram (0.02 mole) ODA into the mica-containing solvent mixture following by gradual adding of 8.7 gram (0.027 mole) BTDA and 18.5 gram (0.063 mole) BPDA to diamines solution.

An apparent inspection after etching procedure showed that the laminate exhibited smooth and flat surface. Peel strength of 1.7 kgf/cm and dimensional stability of −0.03% were obtained.

EXAMPLE 6

Employing the same apparatus and processes and solvent mixture as in Example 1, additional 4. 0 gram (10 weight %)

of silica was added into the solvent mixture. Polyamic acid solution was obtained by dissolving of 7.6 gram (0.07 mole) p-PDA and 4.0 gram (0.02 mole) ODA into the silica-containing solvent mixture following by gradual adding of 8.7 gram (0.027 mole) BTDA and 18.5 gram (0.063 mole) BPDA to diamines solution.

An apparent inspection after etching procedure showed that the laminate exhibited smooth and flat surface. Peel strength of 1.5 kgf/cm and dimensional stability of −0.07% were obtained.

EXAMPLE 7

Employing the same apparatus and processes and solvent mixture as in Example 1, additional 8.0 gram (20 weight %) of silica was added into the solvent mixture. Polyamic acid solution was obtained by dissolving of 7.6 gram (0.07 mole) p-PDA and 4.0 gram (0.02 mole) ODA into the silica-containing solvent mixture following by gradual adding of 8.7 gram (0.027 mole) BTDA and 18.5 gram (0.063 mole) BPDA to diamines solution.

An apparent inspection after etching procedure showed that the laminate exhibited smooth and flat surface. Peel strength of 1.6 kgf/cm and dimensional stability of −0.05% were obtained.

According to examples 2 to 7, the resulting polyimide laminate exhibited an increasing tendency of peel strength as mica or silica was added to the system. It was shown that an addition of mica or silica could dramatically promote the bonding strength between polyimide resin and copper foil. According to the procedures of JIS 6471-8.1, all of present invention embodiments the peel strength results exhibited 0.8 kgf/cm or greater. It was also shown that an addition of mica or silica could dramatically promote the dimensional stability and the surface appearance after etching procedure. According to the procedures of IPC-TM-650, method 2.2.4, most of present invention embodiments the dimensional stability results exhibited not great than ±0.1%. These results were summarized in Table 2 and 3.

TABLE 2

|  | example 2 | example 4 | example 5 |
|---|---|---|---|
| molar ratio of PDA | 78 | 78 | 78 |
| PDA (gram) | 7.6 | 7.6 | 7.6 |
| ODA (gram) | 4 | 4 | 4 |
| mica (%) | 0 | 10 | 20 |
| Peel strength (kgf/cm) | 1.0 | 1.5 | 1.7 |
| Dimensional stability (%) | −0.09 | −0.07 | −0.03 |
| Appearance after etching | good | good | good |

TABLE 3

|  | example 2 | example 6 | example 7 |
|---|---|---|---|
| molar ratio of PDA | 78 | 78 | 78 |
| PDA (gram) | 7.6 | 7.62 | 7.62 |
| ODA (gram) | 4 | 4 | 4 |
| silica (%) | 0 | 10 | 20 |
| Peel strength (kgf/cm) | 1.0 | 1.5 | 1.6 |
| Dimensional stability (%) | −0.09 | −0.07 | −0.05 |
| Appearance after etching | good | good | good |

We claim:

1. A polyimide resin having good thermal stability and good adhesion to a metal foil, said polyimide resin being prepared by dissolving at least one diamine in a polar aprotic solvent followed by adding at least one aromatic tetracarboxylic acid dianhydride to the solution of said aromatic diamine to prepare a polyamic acid solution, imidizing said solution to a polyimide resin by heating at a temperature above 250° C., said polar aprotic solvent comprising at least 1 weight % of acetone and wherein said diamines (a) p-phenylenediamine and (b) 4,4'-oxybisbenzenamine are present in a molar ration of ((a)/(a+b))×100 of from 50 to 95.

2. A polyimide resin according to claim 1, wherein said polar aprotic solvent containing acetone c gram and other solvents d gram, accordingly, (c/(c+d))×100 is from 1 to 30.

3. A polyimide resin according to claim 1, wherein said polyamic acid solution further contains at least 1 weight % of inorganic filler which is selected from the group consisting of mica, silica, calcium carbonate, calcium phosphate, calcium silicate, talc and a combination thereof.

4. A polyimide resin according to claim 1, wherein said polyamic acid solution having a solid content not less than 10 weight % and a viscosity not less than 10000 cps.

5. A polyimide laminate comprising a polyimide layer and a metal foil, wherein said polyimide laminate is produced by casting said polyamic acid solution according to claim 1 onto a surface of a metal foil, followed by imidizing the resultant by heating at a temperature above 250° C.

6. A polyimide laminate according to claim 5, wherein said polyamic acid solution is quantitatively pumped and feed through a slit die and cast onto a surface of a metal foil.

7. A polyimide laminate according to claim 5, wherein said metal foil is copper foil.

8. A polyimide laminate according to claim 5, wherein the thickness of said polyimide layer is from 1/5 to 2 mils.

9. A polyimide laminate according to claim 5, having a peel strength not less than 0.8 kgf/cm according to JIS 6471-8.1.

10. A polyimide laminate according to claim 5, having a dimensional stability not great than 0.1% according to IPC-TM-650, method 2.2.4.

11. A process for producing a polyimide laminate which comprises casting a polyamic acid solution onto a surface of a metal foil, and thereafter removing the solvents by gradual heating at temperatures from 50 to 200° C. and imidizing said polyamic acid by heating at a temperature above 250° C., wherein said polyamic acid solution has a solid content not less than 10 weight % and a viscosity not less than 10000 cps.

12. A process according to claim 11, wherein said polyamic acid solution is casting onto a metal foil by quantitatively pumping through a slit die according to an extrusion means.

13. A process according to claim 11, wherein said polyamic acid solution is being cast onto a metal foil via roll-to-roll processes.

14. A process according to claim 11, wherein said polyamic acid solution comprising a polar aprotic solvent mixture which containing at least 1 weight % of acetone.

15. A process according to claim 11, wherein said polyamic acid solution further comprises at least 1 weight % of inorganic fillers which are selected from the group consisting of mica, silica, calcium carbonate, calcium phosphate, calcium silicate, talc and powder mixed thereof.

16. A process according to claim 11, imidizing of said polyamic acid by heating through a conventional oven, and additionally, a set of infrared radiant heater can be associated with, and the heating profile of infrared radiant heater is set from 300 to 450° C.

* * * * *